United States Patent [19]

Romania

[11] 4,189,201
[45] Feb. 19, 1980

[54] LATCH ASSEMBLY FOR CLAMPING ELECTRONIC COMPONENTS

[75] Inventor: Samuel R. Romania, Phoenixville, Pa.

[73] Assignee: Burroughs Corporation, Detroit, Mich.

[21] Appl. No.: 16,807

[22] Filed: Mar. 2, 1979

[51] Int. Cl.$^2$ .................... H01K 13/62; H01K 13/54
[52] U.S. Cl. ............................................... 339/75 MP
[58] Field of Search .......... 339/75 MP, 75 M, 17 CF, 339/91 R, 119 R; 357/79

[56] References Cited

U.S. PATENT DOCUMENTS 3,942,854   3/1976   Klein et al. ................. 339/75 MP X
3,946,276   3/1976   Braun et al. ...................... 357/79 X Primary Examiner—Joseph H. McGlynn
Assistant Examiner—John S. Brown
Attorney, Agent, or Firm—Francis A. Varallo; Leonard C. Brenner; Kevin R. Peterson

[57] ABSTRACT

A latch assembly is described for applying a high clamping force to an electronic component installed in a suitable connector. The latch assembly insures reliable electrical connection between the component circuit leads and the connector contact elements, as well as a good ground connection between the component and a cooling frame which also serves as the system ground. The present invention finds particular application in the clamping of an interconnect cable assembly. The latter includes flat or ribbon-type cables installed in a suitable housing and adapted to be mounted in a connector. The latch is universal in that it is effective with a single full cable assembly, a pair of split assemblies or a single split assembly. Moreover the latch may be easily applied and removed without the use of tools, thereby facilitating system operations which frequently involve the removal, substitution or interchange of cable assemblies.

11 Claims, 4 Drawing Figures

LATCH ASSEMBLY FOR CLAMPING ELECTRONIC COMPONENTS

CROSS REFERENCE TO RELATED APPLICATIONS

In patent application, Ser. No. 513,283, which issued as U.S. Pat. No. 3,946,276, for "Island Assembly Employing Cooling Means for High density Intergrated Circuit Packaging" by Robert E. Braun et al., there is described and claimed a packaging system having electronic components such as integrated circuit packages and interconnect cable assemblies installed in the same type connectors. A hold down device for clamping such components is described and claimed in patent application Ser. No. 513,282, (U.S. Pat. No. 3,942,854), for "Hold Down Device for Use in Electronic Systems Employing Integrated Circuits" by Peter P. Klein et al. Both of the foregoing applications are assigned to the same assignee as the present application.

BACKGROUND OF THE INVENTION

Electronic equipment, particularly modern data processing systems, entail high density packaging which may involve the installation of pluggable components in receptacles or connectors. Cooling means such as a cooling frame are generally required to maximize the number of integrated circuit components utilized.

In the above referenced Braun et al. patent, there is described and claimed a high density packaging system. This system includes one or more "islands", each of which may be characterized as a plurality of pluggable integrated circuit packages, connectors for receiving the packages, a cooling frame and an interconnection plate or medium which supports the other elements. Additionally, interconnect cable assemblies mounted in the same connectors as those accommodating the integrated circuit packages, permit the transfer of input and/or output information between islands or to other electrical devices which may be included in, or are external to, the system.

In the Klein et al. patent there is disclosed and claimed a basic hold down device for use in clamping the integrated circuit packages in the Braun et al. system. Additionally, due to the different physical configurations of an interconnect cable assembly and an integrated circuit package, a modification of the design of the basic device was taught for use with a cable assembly. As noted in the Klein et al. patent, the basic hold down is functional for the condition that only one integrated circuit section of the pair of sections comprising the so-called "split-package" is installed in a standard connector, as well as the installation of both split-package sections or a single full package. On the other hand, the modified hold down device of Klein et al. is adapted solely for a full cable assembly having a housing which completely spans the connector in which it is installed. Additionally, a simple tool, such as a screw driver, is needed to latch and release the hold down mechanism of both the basic and modified devices.

Subsequently, the need arose for a hold down device for interconnect cable assemblies which was effective for one or a pair of split cable assembly housings installed in a standard connector, as well as a full cable assembly. The cable assemblies are often required to be removed or interchanged among the connectors in the course of system operation, in contrast with the integrated circuit packages which may be considered permanently installed, barring circuit failures. Therefore, it is desirable that the clamp device for such cable assemblies be easily applied or removed without the use of tools of any kind. The latch assembly of the present invention fills such requirements.

SUMMARY OF THE INVENTION

In accordance with the invention a latch assembly is provided which has particular utility in the clamping of the interconnect cable assemblies used in the system of the referenced Braun et al. patent. It should be understood however that the reference system has been chosen solely for illustrative purposes and that the present device is not to be considered limited to use therein. The latch assembly of the present invention insures that electrical continuity is maintained between the conductive pads of the cable assembly and the electrical contacts of the connector into which the cable assembly is plugged. Moreover, a good ground connection is provided between a metallic ground plate within the cable assembly and the system cooling frame which also serves as the system ground.

The physical characteristics of the present latch assembly are best understood by reference to the detailed description of the invention which follows. However in brief, the device comprises a main spring member formed in a shallow, upright, truncated "V" configuration. To the center flat portion of the main spring member, a pressure plate is affixed. At one extremity of the assembly is a spring latch which is operatively coupled to the main spring member by a cam lever, the latter providing relative motion between the spring latch and the main spring member. The latch assembly is positioned between a pair of spaced-apart parallel rods mounted on brackets in proximity to the cooling frame. One of the extremities of the main spring member is permitted to pivot about one of the rods to permit access to the connector but at the same time is restrained thereby. By rotating the cam lever in one direction about the cylindrical projection at the opposite extremity of the main spring member, the spring latch is extended into contact with the other of said pair of rods. In order to apply a clamping force to the cable assembly, the cam lever is rotated in the opposite direction causing the spring latch to firmly engage the rod and the main spring member to be deflected to provide a retaining load. The cam lever rests against the main spring member when the assembly is in a fully latched condition. To remove the cable assembly from the connector, the cam lever is again rotated in the first mentioned direction until the spring latch may be removed from the rod, and then the entire latch assembly is pivoted away from the connector. When arranged in rows and columns in an "island" configuration, the latch assemblies assume a partial mating relationship wherein a given rod provides the latching means for a first row of devices and the pivot means for the next succeeding row. This arrangement affords considerable space economy.

Other features of the invention will become more fully apparent in the detailed description which follows.

DESCRIPTION OF THE PREFERRED EMBODIMENT

Figure 1:
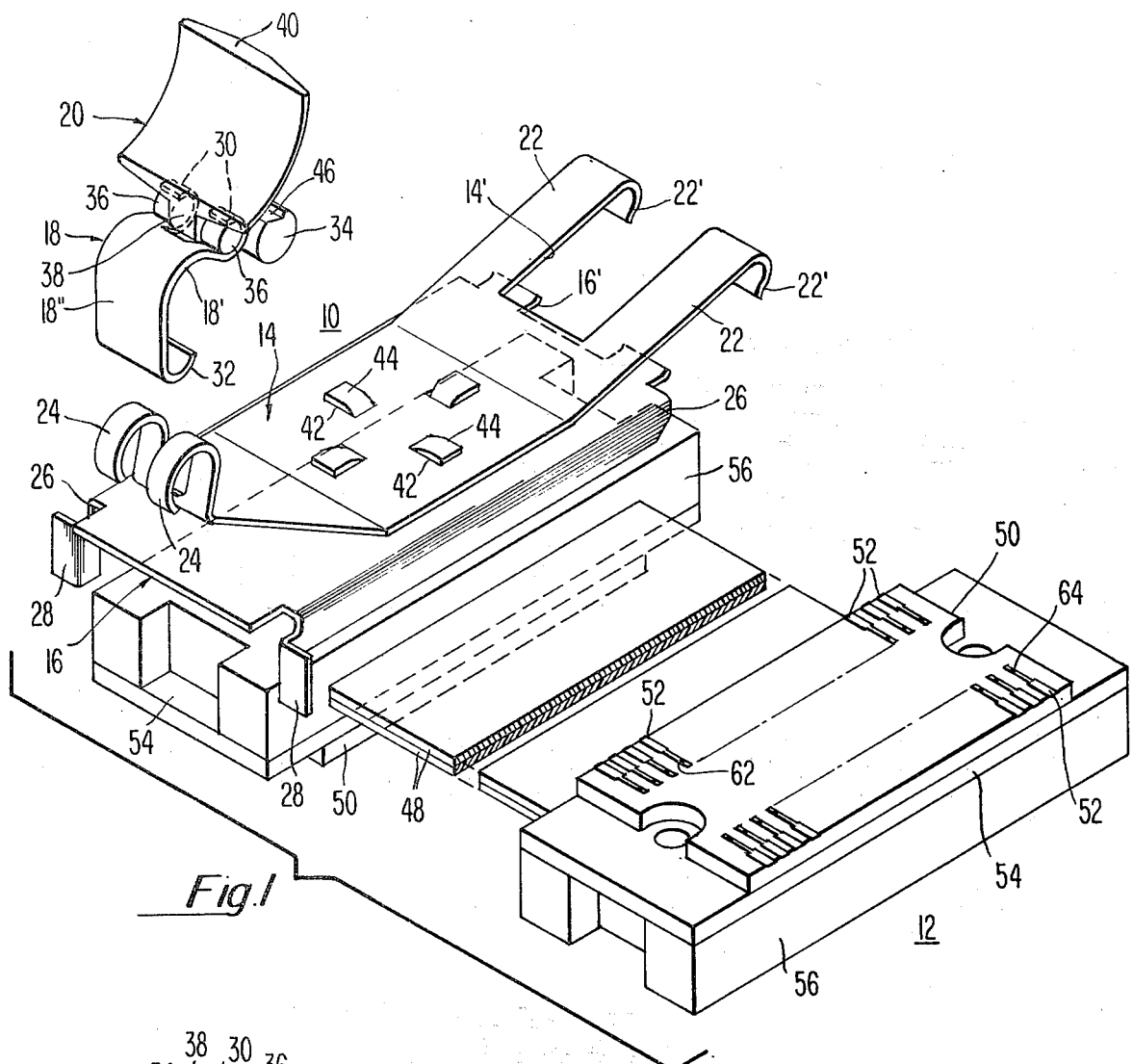
FIG. 1 is an exploded view of the latch assembly of the present invention and an interconnect cable assembly.

FIG. 1 illustrates the latch assembly 10 of the present invention together with an interconnect cable assembly 12 for which its clamping function finds particular application.

The latch assembly 10 is comprised of four elements namely, a main spring 14, a pressure plate 16, a spring latch 18 and a cam lever 20. Considering each of these elements in turn, the main spring 14 is formed in a shallow, upright, truncated "V" configuration. One end of the main spring 14 includes a U-shaped notch 14' and the extremities of the legs 22 of the "U" are curved back on themselves to form side-by-side hook-like members 22'. The opposite end of the main spring 14 includes a single projection, substantially normal to the flat central portion of the spring, and split to provide two substantially circular fingers 24, open at one extremity. During the latching operation, the main spring 14 is deflected toward the interconnect cable assembly 12 as will be described hereinafter, thus providing a retaining load.

The pressure plate 16 is a substantially planar member having longitudinal flanges 26 disposed on opposite sides thereof. At one extremity of the plate 16, the flanges 26 are extended away from the plane of the plate 16 and outward to form ear-like sections 28. The opposite extremity of plate 16 includes a U-shaped notch 16'. The function of pressure plate 16 is to distribute the retaining force supplied by the main spring 14 and to provide a reference plane.

The spring latch 18 is comprised of a substantially S-shaped portion 18' which is split at one extremity to provide two substantially circular fingers 30 open at one extremity. The other extremity of the S-shaped portion is integral with a linear section 18" which terminates in a single hook-like member 32.

The cam lever 20 includes a pair of substantially cylindrical members 34 and 36, of different diameters and having their respective longitudinal axes parallel to each other. The cylindrical members 34 and 36 are retained in spaced-apart relationship by a common narrow supporting strut 38 which is integral with a relatively broad handle 40 of arcuate cross section. The purpose of the cam latch 20 is to introduce relative motion between the spring latch 18 and the main spring 14.

Actual operative embodiments of the invention have been assembled in the following manner. The pressure plate 16 is affixed to the central flat portion of the lower surface of the main spring 14. This is accomplished by an homologous arrangement of apertures 42 in main spring 14 and the pierced and formed tabs 44 in the pressure plate 16. The upright tabs 44 are inserted into apertures 42 and are then bent transversely until they extend beyond the apertures 42 and lie against the surface of the main spring 14. This arrangement allows for the proper alignment of the main spring 14 and pressure plate 16. The U-shaped notch 16' in pressure plate 16 lies below and in substantial alignment with a portion of the notch 14' in the main spring 14, while the legs 22 of the latter extend beyond the pressure plate 16.

The cam lever 20, spring latch 18 and main spring 14 are designed to snap together without the aid of tools. The two substantially circular fingers 24 of the main spring 14 are adapted to receive the larger cylindrical member 34 of cam lever 20. To facilitate this the member 34 has a pawl notch 46 that is used to expand the opening at the extremity of fingers 24, thus permitting it to enter. After entry, the fingers 24 snap back beyond notch 46, preventing inadvertent removal. The circular fingers 30 of spring latch 18 are then pushed over the smaller cylindrical member 36 of cam lever 20 via the opening at the extremities of fingers 30. The respective spaces between the main spring fingers 24 and the spring latch fingers 30 accommodate the supporting strut 38 of the cam lever 20. When fully assembled the fingers 30 of the spring latch 18 rest upon corresponding fingers 24 of the main spring 14 and are free to slide thereover during the latching operation.

Figure 2:
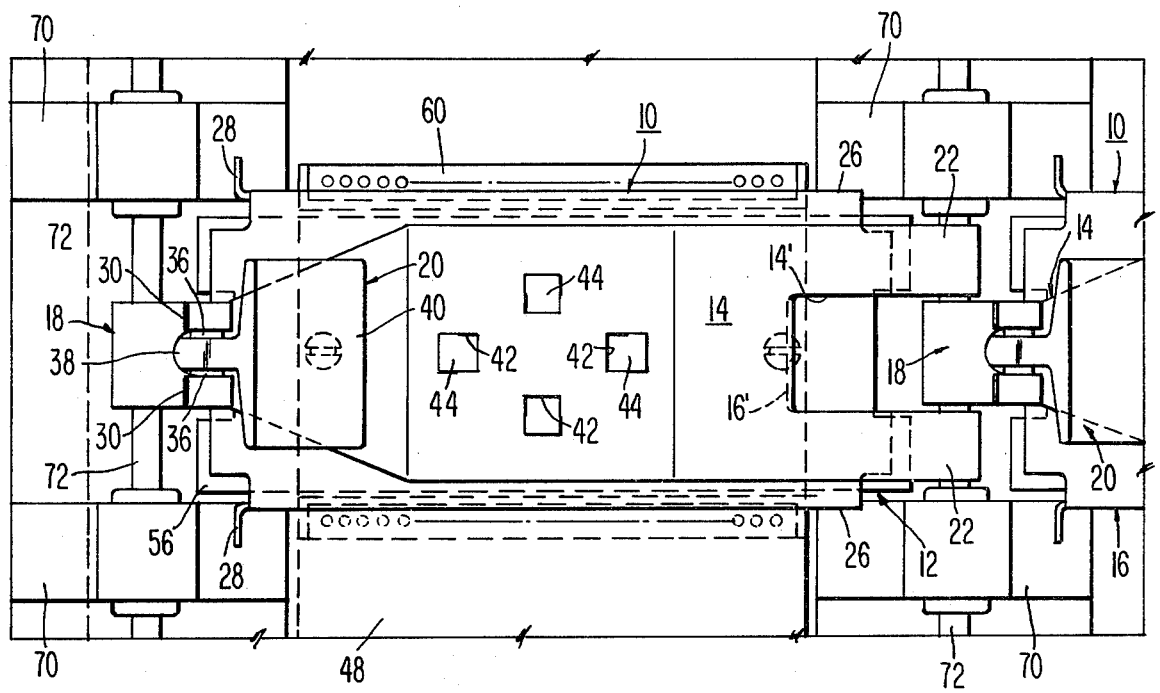
FIG. 2 is an enlarged plan view of a portion of an island structure illustrating the relationship of an interconnect cable assembly, the connector in which it is mounted and the latch assembly.
Figure 3:
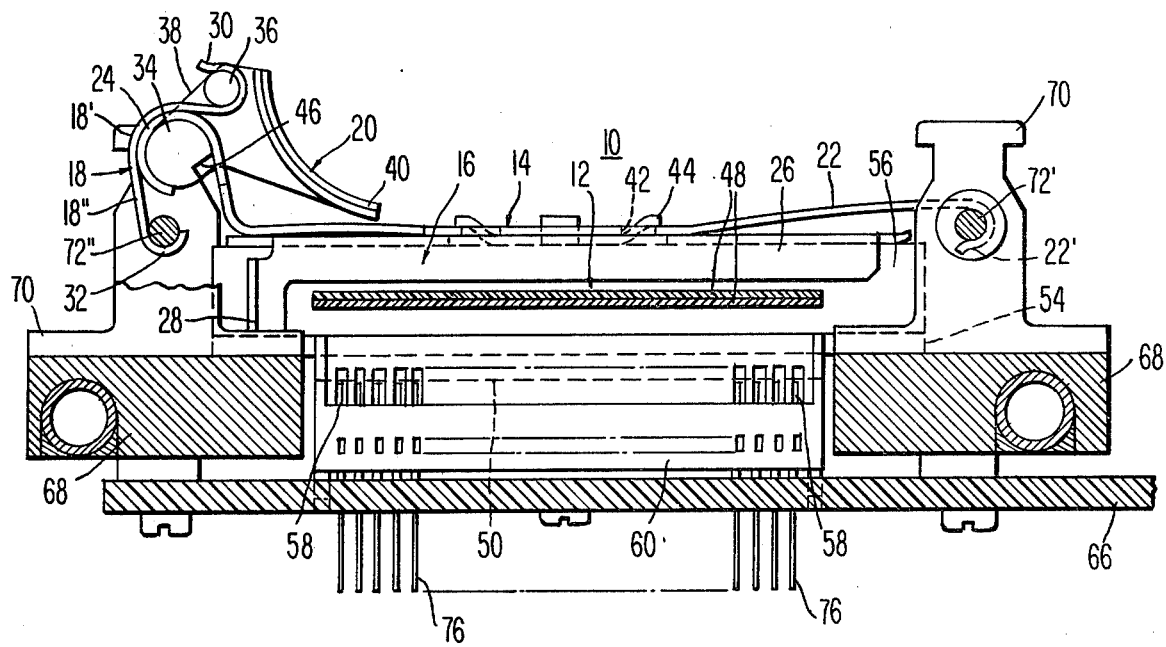
FIG. 3 is an end view of the island fragment depicted in FIG. 2, further illustrating the relationship of the elements when a full interconnect cable assembly is clamped within the connector.

With continued reference to FIG. 1, a full interconnect cable assembly 12 is illustrated. Such an assembly permits input and/or output signal information to be transferred from an island (a small portion of which is seen in FIG. 2) to other islands or to electrical devices which may be included in, or are external to, the system. The cable assembly 12 comprises a pair of flat or ribbon-type cables 48 each having a plurality of conductors, a termination board 50 with a plurality of conductive pads 52, a metallic ground plane member 54, and the housing 56. In a full cable assembly, the termination board pads 52 correspond in number and position to the contacts 58 of connector 60, as seen in FIG. 3. For convenience, the conductors at one end of a cable may be terminated at points 62 along one side of the board, while the conductors at the corresponding end of the other cable may be terminated at points 64 along the opposite side of the board 50. As is illustrated in FIG. 4, the latch assembly 10 of the present invention is also effective with a split interconnect cable assembly 12' which has a physical size (along its longitudinal axis), and an electrical pad and conductor count which is approximately one-half that of the full cable assembly 12.

The latching function performed by the present invention is best appreciated when considered in the environment of the island configuration described and claimed in the above mentioned Braun et al. patent. With continued general reference to FIG. 1 and specific reference to FIGS. 2, 3 and 4 where indicated, the features and advantages concomitant with the operation of the latch assembly 10 will be apparent.

Figure 4:
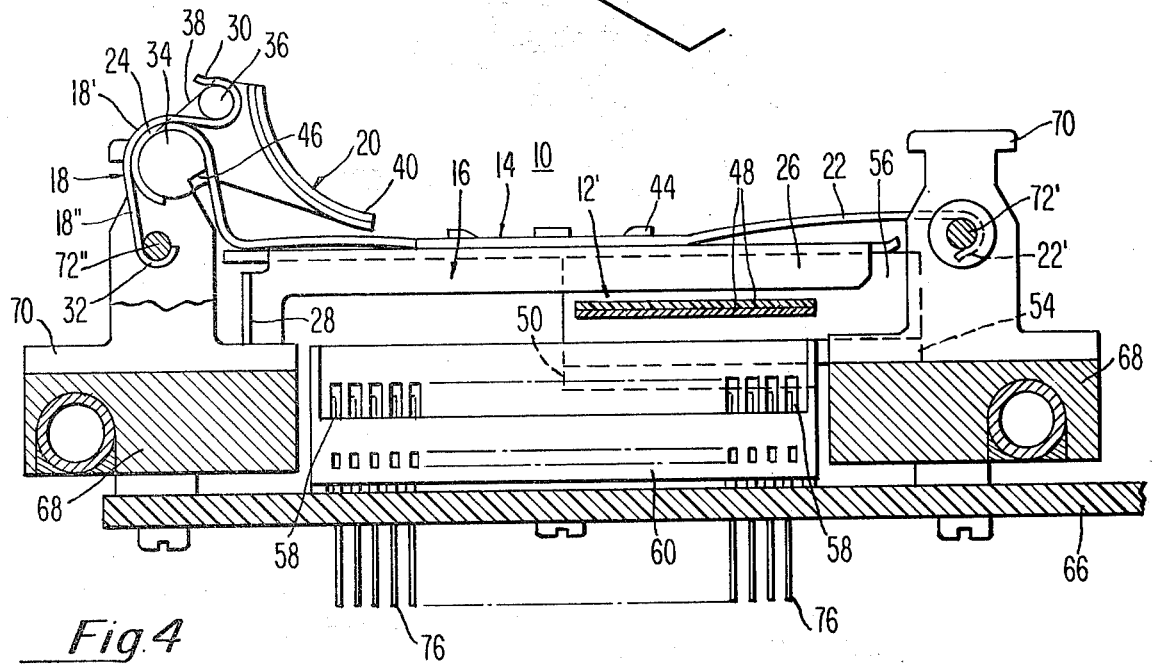
FIG. 4 is similar to FIG. 3 except that the full cable assembly has been replaced by a single split cable assembly.

FIGS. 2-4 inclusive depict a fragment of the island configuration which shows an interconnection plate or medium 66, which may be of the printed circuit board variety, on which are mounted a cooling frame 68 and a connector 60 for receiving an integrated circuit package (not shown) or the pluggable portion of the interconnect cable assembly 12 (12' in FIG. 4). Groups of elevated brackets 70 are fastened to the cooling frame 68 and each group supports a common rod 72, which passes therethrough. Each connector 60 is positioned in a space between an adjacent pair of rods 72. The interconnect cable assembly 12 or 12' is plugged into the connector 60 such that the termination board pads 52 contact corresponding electrical contacts 58 within the connecter 60. The connector contacts 58 also protrude from the lower surface of the connector body where they press against the conductive pads 74 of the interconnection medium 66. These pads 74 in turn may be connected to pins 76 which protrude through the medium 66 and which then may be interconnected by various wiring means, such as wire wrap techniques.

In order to insure electrical continuity between the connector contacts 58 and the termination board pads 52 of the cable assembly 12 or 12' as well as between the ground member 54 of the latter and the cooling frame 68 which serves as the island system ground, the latching assembly 10 of the present invention is applied.

Referring specifically to FIGS. 3 and 4, first the hook members 22' of the legs 22 of the main spring 14 are made to wrap around rod 72' located on one side of the connector 60. The latch assembly 10 is thus restrained thereby. Next, the latch assembly 10 is pivoted around rod 72' toward the cable assembly housing 56 until the surface thereof contacts the area of the pressure plate 16 lying between its flanges 26. The handle 40 of the cam lever 20 which is designed to accommodate the finger of the installer is moved in a first direction away from main spring 14 as the larger cylindrical member 34 is rotated within the circular fingers 24 of the main spring 14. The spring latch 18 is also extended outward, by allowing its fingers 30 to rotate about the small cylindrical member 36. The hook 32 is then moved into engaging relationship with rod 72". Finger pressure is then applied to handle 40 of cam lever 20 to cause the latter to rotate in the opposite direction toward main spring 14. That is, the cam lever 20 pivots on the shaft provided by cylindrical member 34 within the circular fingers 24 of main spring 14. The hook 32 of spring latch 18 firmly engages rod 72". As rotation of the cam lever 20 progresses, the smaller cylindrical member 36 thereof follows an arcuate path about the larger member 34. This causes the pair of circular fingers 30 of spring latch 18 to rotate about cylindrical member 36 in the first mentioned direction, while at the same time being in intimate contact with the corresponding fingers 24 of the main spring 14 and sliding over them in the opposite direction. During this time, the main spring 14 is deflected downward toward the housing 56 of the cable assembly 12 or 12', thereby applying an increasing force thereto via pressure plate 16. Ultimately, the larger diameter portion of the S-shaped section 18' of spring latch 18 is drawn tightly over the circular fingers 24 of the main spring 14 by virtue of the action of the cam level 20. Simultaneously, the handle 40 of cam lever 20 has achieved its maximum excursion, with its extremity approaching the now deflected surface of the main spring 14. At this time, the surface of the pressure plate 16 firmly contacts the surface of the housing 56 of the cable assembly 12 or 12', and the ear-like extensions 28 of the pressure plate flanges 26 rest upon the lower portion of the bracket 70 adjacent the cooling frame 68. Latching is complete. To remove the cable assembly 12 from the connector 60, the installer grasps the handle 40 of the cam lever 20 and rotates it in the first mentioned direction until the hook 32 on the spring latch 18 may be released from the rod 72", and then the entire latch assembly 10 is pivoted around rod 72' away from the connector 60.

Several considerations are noteworthy, at this time. The latching operation is performed without any substantial "over-ride" of main spring 14. That is, at no time during latching is the force which presses down on the housing 56 of the interconnect cable assembly 12 or 12' substantially greater than the final force applied thereto when latching is complete. Stated another way, the maximum deflection of main spring 14 occurs at the fully latched condition. A positively increasing clamping load up to the time of complete latching insures an optimum electrical interface for the cable assembly 12 or 12' with the connector 60 and island cooling frame 68, the system ground. Conversely, such optimum electrical conditions cannot be achieved when the peak clamping load occurs prior to complete latching and the latched load on the electrical component is significantly less than that at the peak. The non-over-ride of main spring 14 is accomplished by utilizing material in the spring latch 18 which is relatively thin compared with that of main spring 14 and which is therefore capable of a predictable deformation during latching. Initially, the aforementioned larger diameter portion of the S-shaped section 18' is designed to be smaller than the diameter defined by the circular fingers 24 of the main spring 14. As latching progresses and the larger diameter portion of section 18' of the spring latch 18 is drawn over the fingers 24, some of the latching force is expended in causing the last mentioned portion of spring latch 18 to open sufficiently in order that it might intimately contact the surface of the fingers 24 of main spring 14.

Another consideration is that in the fully latched condition, the cam lever 20, which in actual operating devices is made of nylon (in contrast with the other elements which are metal), is not subjected to any applied load. The function of cam lever 20 is to provide the means of moving the large diameter portion of section 18' of spring latch 18 over the circular fingers 24 of the main spring 14 during latching. The cam lever 20 itself receives only a fraction of the load applied to the pressure plate 16 during latching and the handle 40 actually is driven toward the main spring 14 by forces generated by the spring latch 18 just prior to the completion of the latching operation. Theoretically, if the cam lever 20 with its associated handle could be removed after latching, without disturbing the other elements of the latch assembly 10, the same clamping forces would continue to be applied to the cable assembly 12 or 12'.

Reference to FIG. 2 indicates that when the electrical components to be clamped are arranged in rows and columns in an "island" configuration, the latch assemblies 10 assume a partial mating relationship afforded by the alignment of the respective U-shaped notches 14' of main spring 14 and 16' of pressure plate 16. Thus, rod 72' provides the pivot means for the hook members 22' of a first row of latch assemblies 10 and the latching means for the hook member 32 of spring latch 18 in the next succeeding row of latch assemblies, 10'. The last mentioned member 32 occupies the space between the legs 22 of spring member 14 of latch assembly 10.

In FIG. 4, it is observed that the latch assembly 10 is effective for a split cable assembly 12'. Preferably, the last mentioned assembly should be installed in the connector 60, adjacent the pivot end of the latch assembly 10. The latch end of the assembly 10 is restrained from downward motion by the ear-like extensions 28 of the pressure plate 16. Should it become necessary to install the split cable assembly 12' in the opposite half of connector 60, it has been found desirable to insert a simulated package of substantially the same form and fit as the cable assembly housing 56 to achieve a better clamping load distribution. In effect, the latch assembly of the present invention achieves a clamping force at the mounting surface while providing a reference plane to maintain the planar relationship between the cable assembly termination board 50 and the connector 60 in which it is mounted.

In conclusion, there has been described a latch assembly suitable for incorporation into the packaging technology needed for high speed electronic systems, such as data processors. It is apparent that depending upon the particular application, changes and modifications of the assembly may be required. Such changes and modifications, insofar as they are not departures from the true scope of the invention, are intended to be covered by the following claims.

I claim:

1. A latch assembly for applying a clamping force to at least one electronic component installed in a connector which is located between an adjacent pair of parallel rods supported by bracket means mounted adjacent a cooling frame comprising:
   a main spring formed in a shallow, upright truncated V configuration, one extremity of said main spring being centrally notched in a U-shaped configuration such that the extremities of the legs of the U are pivotally wrapped around one of said adjacent pair of rods, the opposite extremity of said main spring including a projection which is split to provide a pair of circular spaced-apart fingers open at one extremity,
   a substantially planar pressure plate affixed to the central portion of said main spring and adapted to contact the surface of said electronic component,
   a cam lever comprising first and second spaced-apart cylindrical members having parallel longitudinal axes, a supporting strut joining said cylindrical members to each other,
   a spring latch having at respective opposite ends a pair of circular spaced-apart fingers open at one extremity thereof and a hook-like member for engaging the other of said adjacent pair of rods, said spring latch having an arcuate section adjacent the pair of fingers thereof,
   said first and second cylindrical members being operatively disposed within said fingers of said main spring and said spring latch resulting in corresponding ones of the pairs of fingers being placed in contact with each other, said supporting strut in said cam lever occupying the respective spaces between said pairs of fingers,
   the rotation of said cam lever about said first cylindrical memer in one direction resulting in the rotation of said pair of fingers of said spring latch about said second cylindrical member in an opposite direction while concurrently being drawn over the surface of said fingers of said main spring, said main spring being deflected and applying a clamping force on said electronic component by way of said pressure plate, the resultant engagement of said arcuate section of said spring latch with said fingers of said main spring being indicative of a fully latched condition in said latch assembly.

2. A latch assembly as defined in claim 1 wherein said spring latch is configured to include an S-shaped portion split at one extremity to provide said pair of fingers and having said arcuate section at the other extremity of said portion, the latter section being integral with a linear section terminating in said hook-like member, said arcuate section having an initial diameter less than that of said circular fingers of said main spring, but being temporarily deformed during latching upon being drawn into firm engaging contact with said fingers by said cam lever.

3. A latch assembly as defined in claim 2 further characterized in that said first cylindrical member of said cam lever has a larger diameter than than that of said second cylindrical member.

4. A latch assembly as defined in claim 3 wherein said pressure plate has at one of its extremities a centrally disposed U-shaped notch in substantial alignment with the corresponding notch in said main spring.

5. A latch assembly as defined in claim 4 wherein said pressure plate is formed with longitudinal flanges on opposite sides thereof, the flanges at the extremity of said plate opposite to that having said U-shaped notch being extended away from the plane of the plate and outward to form ear-like extensions, said extensions contacting the base of said bracket when said latch assembly is in a fully latched condition.

6. A latch assembly as defined in claim 5 wherein said cam lever includes a handle of arcuate cross section which is integral with said supporting strut, said handle providing a means for rotating said cam lever during a latching or unlatching operation.

7. A latch assembly as defined in claim 6 wherein said pressure plate is affixed to said main spring by virtue of an homologous arrangement of apertures in said main spring and pierced/formed tabs in said pressure plate, said tabs being inserted in said apertures and being bent transversely to extend beyond said apertures and to lie against the surface of said spring.

8. A latch assembly as defined in claim 7 further characterized in that said first cylindrical member is formed with a pawl notch which permits the expansion of the opening at the extremity of said pair of fingers of said main spring during the disposition of said last mentioned member within the fingers.

9. A latch assembly as defined in claim 8 characterized in that said cam lever is free of any applied load when said latch assembly is in a fully latched condition.

10. A latch assembly as defined in claim 9 further characterized in that a plurality of electronic components are arranged in rows and columns, the spring latch of the latch assembly in one row engaging a rod and lying between the space provided by the U notch of the pair of legs of the main spring of the latch assembly in the adjacent row, which legs have their extremities wrapped around said rod.

11. A latch assembly as defined in claim 10 wherein at least one electronic component is an interconnect cable assembly having a termination board with a plurality of conductive pads, a ground plane member, and a board housing, said main spring exerting a clamping force by way of said pressure plate upon said board housing when in a latched condition, thereby insuring electrical continuity between said conductive pads and the electrical contacts of said connector as well as between said ground plane member and said cooling frame which also serves as a ground bus.

* * * * *